(12) United States Patent
Wang

(10) Patent No.: US 10,667,069 B2
(45) Date of Patent: May 26, 2020

(54) SOURCE SEPARATION FOR REVERBERANT ENVIRONMENT

(71) Applicant: Dolby Laboratories Licensing Corporation, San Francisco, CA (US)

(72) Inventor: Jun Wang, Beijing (CN)

(73) Assignee: Dolby Laboratories Licensing Corporation, San Francisco, CA (US)

(*) Notice: Subject to any disclaimer, the term of this patent is extended or adjusted under 35 U.S.C. 154(b) by 0 days.

(21) Appl. No.: 16/323,763

(22) PCT Filed: Aug. 28, 2017

(86) PCT No.: PCT/US2017/048923
§ 371 (c)(1),
(2) Date: Feb. 6, 2019

(87) PCT Pub. No.: WO2018/044801
PCT Pub. Date: Mar. 8, 2018

(65) Prior Publication Data
US 2019/0191259 A1    Jun. 20, 2019

Related U.S. Application Data

(60) Provisional application No. 62/381,645, filed on Aug. 31, 2016.

(30) Foreign Application Priority Data

Aug. 31, 2016  (CN) .......................... 2016 1 0765121
Aug. 31, 2016  (EP) ..................................... 16186512

(51) Int. Cl.
*H04S 3/00*     (2006.01)
*H04R 3/00*    (2006.01)
(Continued)

(52) U.S. Cl.
CPC ............ *H04S 3/008* (2013.01); *G10L 21/028* (2013.01); *G10L 25/21* (2013.01); *H04R 1/406* (2013.01);
(Continued)

(58) Field of Classification Search
CPC ............ H04R 3/005; H03H 2021/0034; G10L 25/18; G10L 25/21; G10L 25/06
See application file for complete search history.

(56) References Cited

U.S. PATENT DOCUMENTS 8,583,428 B2    11/2013   Tashev
8,812,322 B2    8/2014    Mysore
(Continued)

FOREIGN PATENT DOCUMENTS

GB    2516483         1/2015
WO    2013/030134     3/2013
(Continued)

OTHER PUBLICATIONS

Ozerov, A. et al., "A General Flexible Framework for the Handling of Prior Information in Audio Source Separation", Oct. 17, 2011, IEEE IEEE Transactions on Audio, Speech, and Language Processing, vol. 20 , Issue: 4, pp. 1118-1133.
(Continued)

*Primary Examiner* — Kile O Blair

(57) ABSTRACT

Embodiments of source separation for reverberant environment are disclosed. According to a method, first microphone signals for each individual one of at least one source are captured respectively by at least two microphones for a period during which only the individual one produces sounds. Mixing parameters for modeling acoustic paths between the at least one source and the at least two microphones are learned by a processor based on the first microphone signals. Second microphone signals are captured
(Continued)

respectively by the at least two microphones for a period during which all of the at least one source produce sounds. The reconstruction model is estimated by the processor based on the mixing parameters and second microphone signals. The processor performs the source separation by applying the reconstruction model.

21 Claims, 12 Drawing Sheets

(51) Int. Cl.
*G10L 21/028* (2013.01)
*G10L 25/21* (2013.01)
*H04R 1/40* (2006.01)
*G10L 25/18* (2013.01)
*H03H 21/00* (2006.01)

(52) U.S. Cl.
CPC .............. *H04R 3/005* (2013.01); *G10L 25/18* (2013.01); *H03H 2021/0034* (2013.01); *H04S 2400/15* (2013.01)

(56) References Cited

U.S. PATENT DOCUMENTS

| | | | |
|---|---|---|---|
| 8,843,364 | B2 | 9/2014 | Mysore |
| 9,047,867 | B2 | 6/2015 | Smaragdis |
| 9,165,565 | B2 | 10/2015 | Mysore |
| 9,351,093 | B2 | 5/2016 | Kim |
| 2010/0174389 | A1 | 7/2010 | Blouet |
| 2011/0194709 | A1 | 8/2011 | Ozerov |
| 2012/0143604 | A1 | 6/2012 | Singh |
| 2014/0358534 | A1 | 12/2014 | Sun |
| 2015/0243284 | A1 | 8/2015 | Guo |
| 2015/0348537 | A1 | 12/2015 | Le Roux |
| 2016/0073198 | A1 | 3/2016 | Vilermo |
| 2016/0189731 | A1 | 6/2016 | Hennequin |
| 2016/0196833 | A1 | 7/2016 | Godsill |

FOREIGN PATENT DOCUMENTS

| | | |
|---|---|---|
| WO | 2014/195132 | 12/2014 |
| WO | 2015/165539 | 11/2015 |

OTHER PUBLICATIONS

Le Roux, J. et al., "Deep NMF for Speech Separation", Apr. 19-24, 2015 IEEE International Conference on Acoustics, Speech and Signal Processing (ICASSP) Year: 2015, pp. 66-70.

Duong, Ngoc., "Under-Determined Reverberant Audio Source Separation Using a Full-Rank Spatial Covariance Model", IEEE Transactions on Audio, Speech, and Language Processing Year: 2010, vol. 18, Issue: 7, pp. 1830-1840.

Fakhry, Mahmoud. et al., "Reverberant audio source separation using partially pre-trained nonnegative matrix factorization", 2014 14th International Workshop on Acoustic Signal Enhancement (IWAENC), Year: 2014, pp. 273-277.

Joonas, Nikunen et al., "Multichannel audio separation by direction of arrival based spatial covariance model and non-negative matrix factorization", 2014 IEEE International Conference on Acoustics, Speech and Signal Processing (ICASSP) Year: 2014, pp. 6677-6681.

Antoine, Liutkus et al., "An overview of informed audio source separation", 2013 14th International Workshop on Image Analysis for Multimedia Interactive Services (WIAMIS), Year: 2013, pp. 1-4.

Zegers, Jeroen et al., "Joint Sound Source Separation and Speaker Recognition" Apr. 29, 2016, XP055347044, URL:https://arxiv.org/pdf/1604.08852.pdf (retrieved on Feb. 8, 2017)sections 2 and 3.

Fakhry, Mahmoud et al., "Audio source separation using a redundant library of source spectral bases for non-negative tensor factorization", 2015 IEEE International Conference on Acoustics, Speech and Signal Processing (ICASSP), Year: 2015, pp. 251-255.

Virtanen, Tuomas et. al., "Spectral covariance in prior distributions of non-negative matrix factorization based speech separation", 2009 17th European Signal Processing Conference, Year: 2009, pp. 1933-1937.

Arberet, S. et al., "Nonnegative matrix factorization and spatial covariance model for under-determined reverberant audio source separation", 10th International Conference on Information Science, Signal Processing and their Applications (ISSPA 2010), Year: 2010, pp. 1-4.

Ozerov, A. et al "Multichannel Nonnegative Matrix Factorization in Convolutive Mixtures for Audio Source Separation" IEEE Transactions on Audio, Speech, and Language Processing, vol. 18, No. 3, Mar. 2010, pp. 550-563.

Leglaive, S. et al "Multichannel Audio Source Separation with Probabilistic Reverberation Modeling" IEEE Workshop on Applications of Signal Processing to Audio and Acoustics, Oct. 18-21, 2015, New Paltz, NY, pp. 1-5.

Duong, Ngoc, Q.K. et al "Spatial Covariance Models for Under-Determined Reverberant Audio Source Separation" IEEE Workshop on Applications of Signal Processing to Audio and Acoustics, Oct. 18-21, 2009, New Paltz, NY, pp. 129-132.

Wang, Z. et al "Discriminative Non-Negative Matrix Factorization for Single-Channel Speech Separation" IEEE International Conference on Acoustics, Speech and Signal Processing, May 4-9, 2014, pp. 749-3753.

Fevotte, C. et al "Nonnegative Matrix Factorization with the Itakura-Saito Divergence: With Application to Music Analysis" IEEE Neural Computation, vol. 21, Issue 3, Mar. 2009, pp. 793-830.

SOURCE SEPARATION FOR REVERBERANT ENVIRONMENT

TECHNICAL FIELD

Example embodiments disclosed herein relate to audio signal processing. More specifically, example embodiments relate to source separation from audio mixtures captured in reverberant environments.

BACKGROUND

Mixed audio signals presented in multi-channel format (e.g., stereo, beamforming, 5.1, 7.1 and the like, are created by mixing different audio sources in a studio, or generated from a plurality of recordings of various audio sources in a real environment. Source separation is useful for a wide range of audio processing applications. For example, when recording an auditory scene using one or more microphones, it is preferred that sound source dependent information be separated for uses in a variety of subsequent audio processing tasks. The examples of such applications include re-mixing/re-authoring applications, spatial audio coding, 3D sound analysis and synthesis, and rendering the sources in an extended play-back environment (rather than the original mixed audio signals). Other applications require source parameters to enable source-specific analysis and post-processing, such as pitch correction, time warping, sound effects, boosting, attenuating, or leveling certain sources.

Source separation consists of recovering either the source signals or their spatial images given the mixed signal. Most existing approaches transform signals into time-frequency domain via the short-time Fourier transform (STFT) and approximate the mixing process in each frequency bin by a complex-valued mixing matrix or spatial covariance matrix. Source separation is then achieved by estimating the mixing matrices or spatial covariance in all frequency bins and deriving the source STFT coefficients. An example method of recovering source signals is by way of estimating the mixing matrices and thereafter deriving the source STFT coefficients as described in A. Ozerov, C. Fevotte, "Multichannel Nonnegative Matrix Factorization in Convolutive Mixtures for Audio Source Separation," IEEE Trans ASLP Vol. 18, No. 3, 2010, the contents of which are incorporated in their entirety herein (referred to as "reference 1" hereafter). Another example method of recovering spatial images of sources is by way of estimating the spatial covariance and deriving the source STFT coefficients as described in Ngoc Q. K. Duong, E. Vincent, R. Gribonvoal, "Spatial Covariance Models for Under-determined Reverberant Audio Source Separation," IEEE Workshop on Application of Signal Processing to Audio and Acoustics, 2009, the contents of which are incorporated in their entirety herein (referred to as "reference 2" hereafter).

SUMMARY

Example embodiments disclosed herein describe a method of generating a reconstruction model for source separation. According to the method, mixing parameters for modeling acoustic paths between at least one source and at least two microphones are learned by a processor based on first microphone signals. It is assumed that the first microphone signals for each individual one of the at least one source are captured respectively by the at least two microphones for a period during which only the individual one produces sounds. The reconstruction model is estimated by the processor based on the mixing parameters and second microphone signals. It is assumed that the second microphone signals are captured respectively by the at least two microphones for a period during which all of the at least one source produce sounds.

Example embodiments disclosed herein also describe a method for source separation. According to the method, first microphone signals for each individual one of least one source are captured respectively by at least two microphones for a period during which only the individual one produces sounds. Mixing parameters for modeling acoustic paths between at least one source and the at least two microphones are learned by a processor based on the first microphone signals. Second microphone signals are captured respectively by the at least two microphones for a period during which all of the at least one source produce sounds. The reconstruction model is estimated by the processor based on the mixing parameters and second microphone signals. The processor performs the source separation by applying the reconstruction model.

Further features and advantages of the example embodiments disclosed herein, as well as the structure and operation of the example embodiments, are described in detail below with reference to the accompanying drawings. It is noted that the example embodiments are presented herein for illustrative purposes only. Additional embodiments will be apparent to persons skilled in the relevant art(s) based on the teachings contained herein.

BRIEF DESCRIPTION OF DRAWINGS

Embodiments disclosed herein are illustrated by way of example, and not by way of limitation, in the figures of the accompanying drawings and in which like reference numerals refer to similar elements and in which.

DETAILED DESCRIPTION

Figure 1:
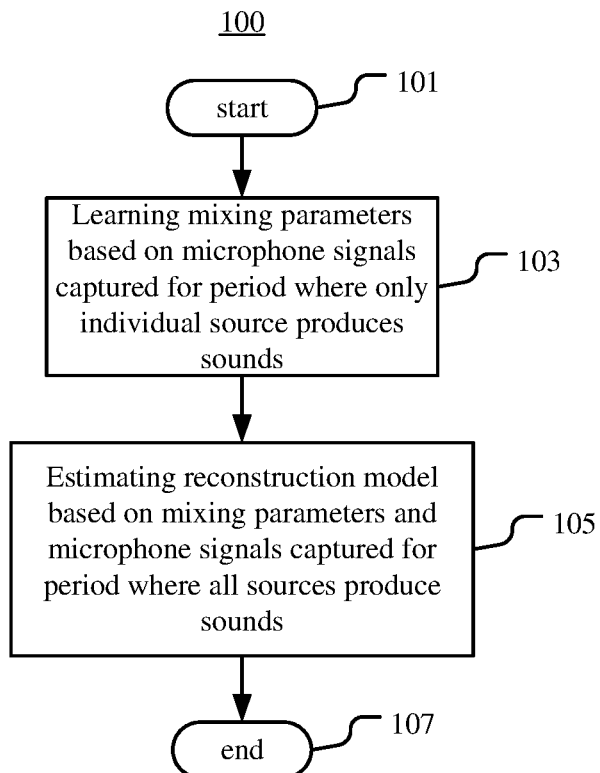
FIG. 1 is a flow chart illustrating an example method of generating a reconstruction model for source separation according to an example embodiment.

The example embodiments are described by referring to the drawings. It is to be noted that, for purpose of clarity, representations and descriptions about those components and processes known by those skilled in the art but unrelated to the example embodiments are omitted in the drawings and the description.

As will be appreciated by one skilled in the art, aspects of the example embodiments may be embodied as a system, method or computer program product. Accordingly, aspects of the example embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the example embodiments may take the form of a computer program product tangibly embodied in one or more computer readable medium(s) having computer readable program code embodied thereon.

Aspects of the example embodiments are described below with reference to flowchart illustrations and/or block diagrams of methods, apparatus (as well as systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Source separation problem is particularly difficult in the reverberant environment. In practice, reverberation increases the spatial spread of each source, due to echoes at many different positions on the walls of the recording room. The effectiveness of state-of-art approaches have been shown in certain context where the source positions and some room characteristics are known. For example, in the method described in reference 2, source separation for a reverberant speech mixture is demonstrated under an assumption that the source spatial covariance matrices are known. However, this is usually not practical for most real-world applications because such information is usually not available or impractical to obtain, including the microphones' set-up and sources' positions, room shape, size, wall reflection factor.

In view of the foregoing, a solution is proposed for source separation in a semi-supervised context by analyzing recorded audio signals only, without knowing any prior information about the properties of the recording devices, the acoustic properties of the room, etc.

Specifically, the solution includes a training phase and a testing phase for estimating a reconstruction model for source separation. The training phase has the same environment set-up as the testing phase. Each source sounds for a certain period (e.g., seconds or at most minutes as typical rehearsal length, and the content doesn't need to be the same as it is in the testing phase). Multi-channel microphone recordings are made for each individual source. In the training phase, parameters (e.g., mixing parameters and spectral basis) depending on each individual source and acoustic paths (including mixing paths and Room Impulse Response (RIR)) between the individual source and microphones are learned. Because these parameters are irrelevant to other sources than the individual source on which the parameters depend, microphone signals can be captured when only the individual source is sounding and the parameters can be learned based on the microphone signals, with no interference and complexity induced by the other sources. In the testing phase, the reconstruction model is estimated with the parameters learned in the training phase fixed. Further, in the testing phase, parameters depending on all the sources are estimated. Because some parameters have been learned in the training phase and they are invariant or at least consistent in the testing phase, the estimation can be achieved with higher accuracy and lower complexity in the testing phase.

FIG. 1 is a flow chart illustrating an example method 100 of generating a reconstruction model for source separation according to an example embodiment.

According to FIG. 1, the method 100 starts from step 101. At step 103 (training phase), mixing parameters A for modeling acoustic paths between sources $s_1, \ldots, s_J$ and microphones $mic_1, \ldots, mic_I$ are learned based on microphone signals $x_1, \ldots, x_I$. It is assumed that the microphone signals $x_{j,1}, \ldots x_{j,I}$ for each source $s_j$ ($j=1, \ldots, J$) of the sources $s_1, \ldots s_J$ are captured respectively by the microphones $mic_1, \ldots mic_I$ for a period during which only the source $s_j$ produces sounds. Mixing parameters $A_j$ for modeling acoustic paths between the sources $s_j$ and microphones $mic_1, \ldots, mic_I$ are learned based on the microphone signals $x_{j,1}, \ldots x_{j,I}$. Any known method of learning mixing parameters based on microphone signals can be applied in this step based on the microphone signals captured during a period where only one source produces sounds.

At step 105 (testing phase), the reconstruction model is estimated based on the mixing parameters learned in the training phase and microphone signals $x'_1, \ldots, x'_I$. It is assumed that the microphone signals $x'_1, \ldots x'_I$ are captured respectively by the microphones $mic_1, \ldots, mic_I$ for a period during which all of the sources $s_1, \ldots s_J$ produce sounds. In this step, any known method of estimating the reconstruction model can be applied by using the mixing parameters learned in step 103 as fixed parameters. At step 107, the method 100 ends.

In the method 100, one or more source or its spatial image may be reconstructed by the reconstruction model. The number J may be one or more than one.

In the method 100, the signal to be reconstructed by the reconstruction model for a source may be the source itself (e.g., source signal) or spatial images of the source on microphones. The spatial images of the source on the microphones are the contribution of the source in the microphone signals captured by the microphones. In the case of spatial image, there is no need to reconstruct the source.

Figure 3:
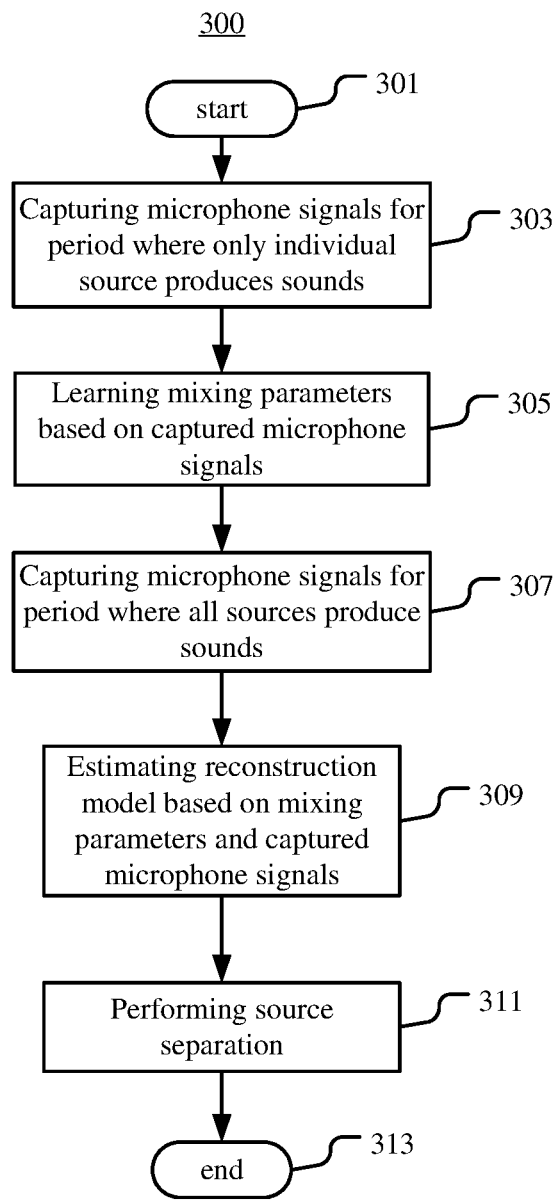
FIG. 3 is a flow chart illustrating an example method for source separation according to an example embodiment.

FIG. 3 is a flow chart illustrating an example method 300 for source separation according to an example embodiment. According to FIG. 3, the method 300 starts from step 301.

At step 303, microphone signals $x_{j,1}, \ldots x_{j,I}$ for each source $s_j$ ($j=1, \ldots J$) of the sources $s_1, \ldots s_J$ are captured respectively by the microphones $mic_1, \ldots mic_I$ for a period during which only the source $s_j$ produces sounds.

At step 305, mixing parameters A for modeling acoustic paths between sources $s_1, \ldots, s_J$ and microphones $mic_1, \ldots, mic_I$ are learned based on microphone signals $x_1, \ldots, x_I$. For each source $s_j$ (j=1, J), mixing parameters $A_j$ for modeling acoustic paths between the sources $s_j$ and microphones $mic_1, \ldots, mic_I$ are learned based on the microphone signals $x_{j,1}, \ldots x_{j,I}$. Any known method of learning mixing parameters based on microphone signals can be applied in this step based on microphone signals captured during a period where only one source produces sounds.

At step 307, microphone signals $x'_1, \ldots x'_I$ are captured respectively by the microphones $mic_1, \ldots, mic_I$ for a period during which all of the sources $s_1, \ldots s_J$ produce sounds.

At step 309, the reconstruction model is estimated based on the mixing parameters learned in the training phase and microphone signals $x'_1, \ldots, x'_I$. In this step, any known method of estimating the reconstruction model can be applied by using the mixing parameters learned in step 305 as fixed parameters.

At step 311, the source separation is performed by applying the reconstruction model. At step 313, the method 300 ends.

In the method 300, step 307 may also be executed at any time before step 305. Steps of 303 and 307 may be executed on a recording device. Steps 305 and 309 may be executed on a server or one or more servers and/or distributed servers. The captured microphone signals may be transferred via a storage medium, a communication connection or a network from the recording device to the server for executing the training phase and the testing phase, for example. The estimated reconstruction model may be transferred from the server to the recording device so that the recording device can apply the reconstruction model to captured microphone signals for source separation. The microphone signals recorded by the recording device may also be transferred to a device other than the recording device, or even to the server so that the device or the server can apply the reconstruction model to captured microphone signals for source separation.

Various reconstruction models based on the mixing parameters may be used in the methods according to example embodiments disclosed herein. Further, various methods for estimating the reconstruction models and for learning the mixing parameters may be used in the methods according to example embodiments disclosed herein. Some examples will be described in detail in the following.

In a further example embodiment, the reconstruction model is adapted to reconstruct spatial images of the sources $s_1, \ldots s_J$ on the microphones $mic_1, \ldots, mic_I$.

In an example scenario, each source $s_j$ of sources $s_1, s_J$ can produce spatial image $s_{ji}^{img}$ on each microphone $mic_i$ of the microphones $mic_1, \ldots, mic_I$. That is, each source $s_j$ can produce I spatial images $s_{j1}^{img}, \ldots, s_{jI}^{img}$ on the microphones $mic_1, \ldots, mic_I$ respectively. In the training phase, the microphone signals for source $s_j$ can be expressed as $$\begin{cases} x_{j,1} = a_{1,j}s_j \\ x_{j,2} = a_{2,j}s_j = \dfrac{a_{2,j}}{a_{1,j}}x_{j,1} \\ \vdots \\ x_{j,I} = a_{I,j}s_j = \dfrac{a_{I,j}}{a_{1,j}}x_{j,1} \end{cases}$$

where $s_{ji}^{img}=a_{i,j}s_j, \ldots s_j$ represents source $s_j$, $a_{i,j}$ represents the acoustic path between source $s_j$ and microphone $mic_i$, i=1, . . . , I. Mixing parameters for each source $s_j$ can be characterized as $$A_j = \left[1, \frac{a_{2,j}}{a_{1,j}}, \ldots, \frac{a_{I,j}}{a_{1,j}}\right]^T,$$

representing ratios between spatial images $s_{j1}^{img}, \ldots, s_{jI}^{img}$ of the source $s_j$ on the microphones $mic_1, \ldots, mic_I$ and the spatial image $s_{j1}^{img}$ of the source $s_j$ on a reference one ($mic_1$, in this example) of the microphones $mic_1, \ldots, mic_I$. The reference microphone can be any one of the microphones $mic_1, \ldots mic_I$. Also in this example, in the testing phase, the microphone signals can be expressed as $$\begin{cases} x_1 = \sum_{j=1}^{J} a_{1,j}\tilde{s}_j \\ x_2 = \sum_{j=1}^{J} a_{2,j}\tilde{s}_j = \sum_{j=1}^{J} \dfrac{a_{2,j}}{a_{1,j}}a_{2,j}\tilde{s}_j \\ \vdots \\ x_I = \sum_{j=1}^{J} a_{I,j}\tilde{s}_j = \sum_{j=1}^{J} \dfrac{a_{I,j}}{a_{1,j}}a_{1,j}\tilde{s}_j \end{cases}$$

where $\tilde{s}_j$ represents source $s_j$ in the testing phase. Any reconstruction model based on such mixing parameters can be used in this example. One example reconstruction model can be implemented by using Wiener filtering method which will be described in more details.

In another example scenario, each source $s_j$ can produce I spatial images $s_{j1}^{img}, \ldots s_{jI}^{img}$ on the microphones $mic_1, \ldots mic_I$ respectively. Mixing parameters for each source $s_j$ can be characterized as spatial covariance of source $s_j$, representing the source $s_j$'s spatial property.

Any reconstruction model based on such mixing parameters can be used in this example.

Figure 2:
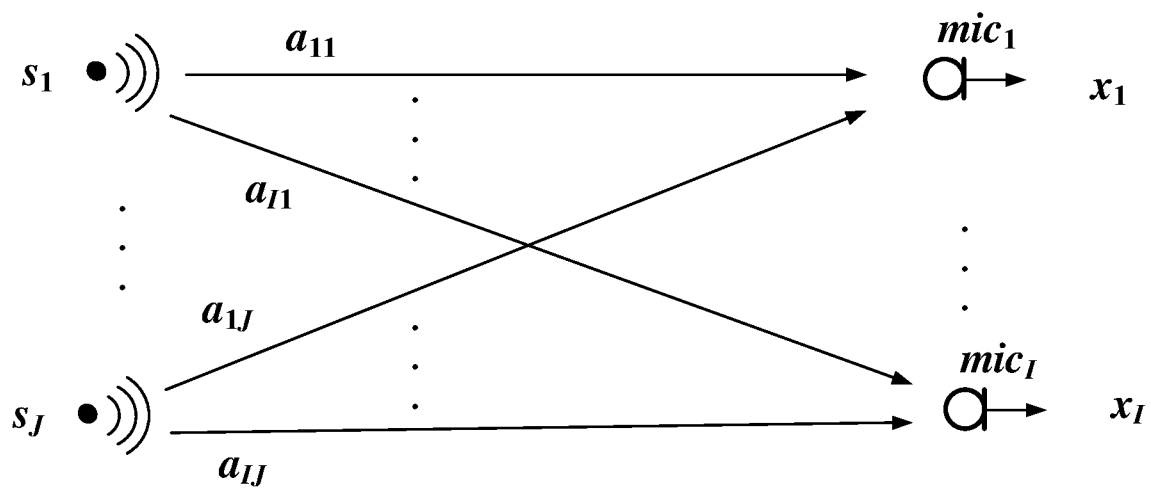
FIG. 2 is a diagram schematically illustrating an example relation between sources and microphones in an example embodiment.

In a further example embodiment, the reconstruction model is adapted to reconstruct a source signal of each of the original source $s_1, \ldots, s_J$. The mixing parameters model the acoustic paths between the original source $s_1, \ldots, s_J$ and the microphones $mic_1, \ldots, mic_I$. FIG. 2 is a diagram schematically illustrating the relation between original sources and microphones in this embodiment. As illustrated in FIG. 2, mixing parameters $A_j e [\alpha_{1j}, \ldots, a_{Ij}]^T$ model acoustic paths between the original source $s_j$ and the microphones $mic_1, \ldots mic_I$.

In this embodiment, the convolution mixing model in frequency domain can be approximated as:

$$X_{fn}=A_f S_{fn}+B_f \quad (1)$$

where
f=1, . . . , F represents the frequency bin index, n=1, . . . , N represents the time frame index, I represents the number of microphones, J represents the number of sources, X is an I×1 matrix representing STFTs of I microphone signals for the f-th frequency bin and the n-th time frame, $B_f$ is an I×1 matrix representing STFTs of I-channel noises for the f-th frequency bin, and these variables have the same meaning in the following equations,
$S_{fn}$ is a J×1 matrix representing STFTs of J unknown sources for the f-th frequency bin and the n-th time frame, $A_f=[\alpha_{ij}]_f$ is an I×J matrix representing mixing parameters for the f-th frequency bin, which are frequency-dependent and time-invariant.

Non-negative matrix factorization (NMF) and discriminative non-negative matrix factorization are methods for source separation by modeling each source's spectrograms as non-negative combinations of basis vectors (also referred to as spectral bases). The spectral bases are source-dependent and can be learned from the source's audio samples. It is also possible to learn spectral bases of the sources in the training phase and use the learned spectral bases in the testing phase.

Figure 4:
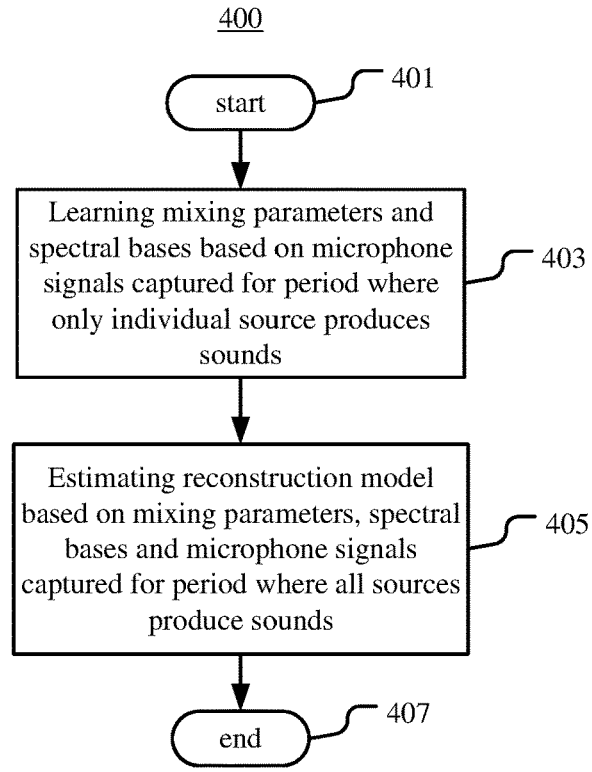
FIG. 4 is a flow chart illustrating an example method of generating a reconstruction model for source separation according to an example embodiment.

FIG. 4 is a flow chart illustrating an example method 400 of generating a reconstruction model for source separation according to an example embodiment. According to FIG. 4, the method 400 starts from step 401.

At step 403 (training phase), mixing parameters A for modeling acoustic paths between sources $s_1, \ldots s_J$ and microphones $mic_1, \ldots, mic_I$ are learned based on microphone signals $x_1, \ldots, x_I$. Spectral bases of the sources are also learned based on microphone signals $x_1, \ldots, x_I$. The spectral bases may be learned via the non-negative matrix factorization method or the discriminative non-negative matrix factorization method. It is assumed that the microphone signals $x_{j,1}, \ldots, x_{j,I}$ for each source $s_j$ (j=1, ..., J) of the sources $s_1, \ldots s_J$ are captured respectively by the microphones $mic_1, \ldots, mic_I$ for a period during which only the source $s_j$ produces sounds. Mixing parameters $A_j$ for modeling acoustic paths between the sources $s_j$ and microphones $mic_1, \ldots, mic_I$ as well as the associated spectral bases are learned based on the microphone signals $x_{j,1}, \ldots, x_{j,I}$. Any known method of learning mixing parameters based on microphone signals can be applied in this step based on microphone signals captured during a period where only one source produces sounds.

At step 405 (testing phase), the reconstruction model is estimated based on the mixing parameters and the spectral bases learned in the training phase, and microphone signals $x'_1, \ldots, x'_I$. It is assumed that the microphone signals $x'_1, \ldots x'_I$ are captured respectively by the microphones $mic_1, \ldots, mic_I$ or a period during which all of the sources $s_1, \ldots s_J$ produce sounds. In this step, any known method of estimating the reconstruction model can be applied by using the mixing parameters and the spectral bases learned in step 403 as fixed parameters. At step 407, the method 400 ends.

Figure 5:
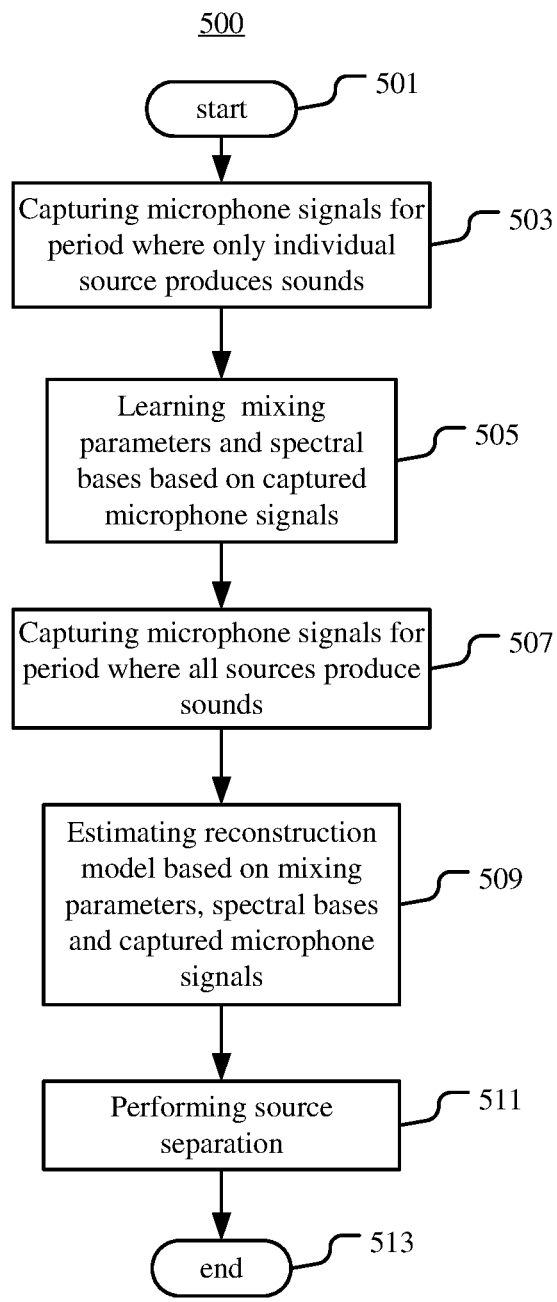
FIG. 5 is a flow chart illustrating an example method for source separation according to an example embodiment.

FIG. 5 is a flow chart illustrating an example method 500 for source separation according to an example embodiment. According to FIG. 5, the method 500 starts from step 501.

At step 503, microphone signals $x_{j,1}, \ldots, x_{j,I}$ for each source $s_j$ (j=1, ..., J) of the sources $s_a, \ldots, s_J$ are captured respectively by the microphones $mic_1, \ldots, mic_I$ for a period during which only the source $s_j$ produces sounds.

At step 505, mixing parameters A for modeling acoustic paths between sources $s_1, \ldots, s_J$ and microphones $mic_1, \ldots, mic_I$ are learned based on microphone signals $x_1, \ldots, x_I$. Spectral bases of the sources are also learned based on microphone signals $x_1, \ldots, x_I$. The spectral bases may be learned via the non-negative matrix factorization method or the discriminative non-negative matrix factorization method. For each source $s_j$ (j=1, J), mixing parameters $A_j$ for modeling acoustic paths between the sources $s_j$ and microphones $mic_1, \ldots, mic_I$ as well as the associated spectral bases are learned based on the microphone signals $x_{j,1}, \ldots, x_{j,I}$. Any known method of learning mixing parameters based on microphone signals can be applied in this step based on microphone signals captured during a period where only one source produces sounds.

At step 507, microphone signals $x'_1, \ldots, x'_I$ are captured respectively by the microphones $mic_1, \ldots, mic_I$ for a period during which all of the sources $s_1, \ldots, s_J$ produce sounds.

At step 509, the reconstruction model is estimated based on the mixing parameters and the spectral bases learned in the training phase, and microphone signals $x'_1, \ldots, x'_I$. In this step, any known method of estimating the reconstruction model can be applied by using the mixing parameters and the spectral bases learned in step 505 as fixed parameters.

At step 511, the source separation is performed by applying the reconstruction model. At step 513, the method 500 ends.

In learning the mixing parameters, the spectral bases or the reconstruction model, it is possible to apply an iterative algorithm to update estimation of various parameters such as mixing parameters, spectral basis, activation parameters, source's power spectrogram and so on. For example, the termination criterion for the iterative algorithm can be having reached a maximum allowed iteration counts, or having reached a condition that the mixing parameters have converged (e.g., the change of estimated parameters or the cost based on the estimated parameters between two successive iterations is small enough). An example convergence condition can be expressed as:

$$\frac{\sum_n \|A^{new} - A^{old}\|_F}{\sum_n \|A^{new}\|_F} < \Gamma$$

where $\| \|_F$ represents Frobenius norm, $A^{new}$ and $A^{old}$ represent mixing parameters estimated in the present iteration and the previous iteration, and $\Gamma$ represent a threshold.

Figure 6:
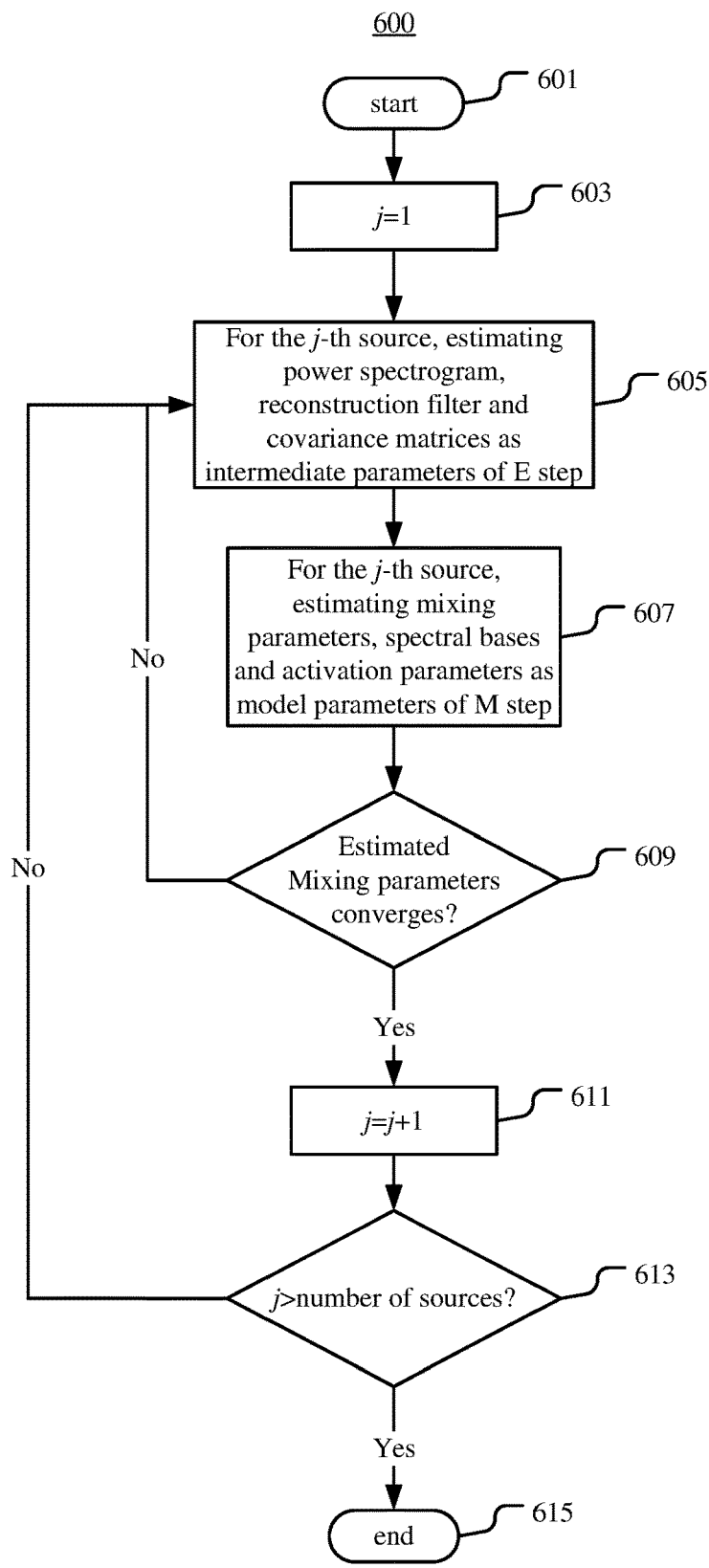
FIG. 6 is a flowchart illustrating an example process of learning the mixing parameters and the spectral bases in an example embodiment.
Figure 7:
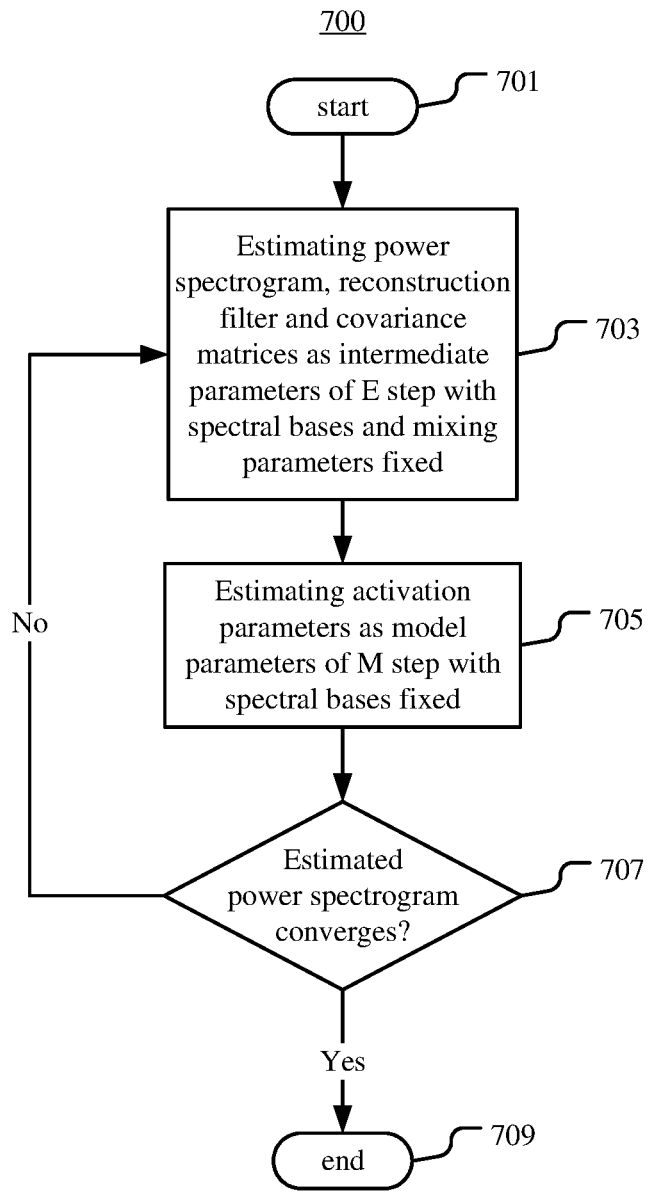
FIG. 7 is a flowchart illustrating an example process of estimating the reconstruction model in this embodiment.

In a further embodiment of the method 400 or the method 500, the estimating of the reconstruction model is completed on condition that the power spectrogram of each source converges. The estimating of the reconstruction model comprises deriving the power spectrogram from estimated covariance of the sources. FIG. 6 is a flowchart illustrating an example process 600 of learning the mixing parameters and the spectral bases in this embodiment. FIG. 7 is a flowchart illustrating an example process 700 of estimating the reconstruction model in this embodiment. Expectation-maximization (EM) algorithms are used in the processes 600 and 700.

As illustrated in FIG. 6, the process 600 starts from step 601. At step 603, a counter j is set for example to 1. In another example embodiment, parameters to be estimated can be set to initial values. At step 605, an expectation (E) step of EM iteration is performed, where power spectrograms of sources, a reconstruction filter such as Wiener filter, extended Kalman filter and the like, a spectral covariance matrix between sources and a cross covariance matrix between microphones and sources are estimated as intermediate parameters.

For example, power spectrograms $\hat{\Sigma}_{s,fn}$ of J sources can be estimated as:

$$\hat{\Sigma}_{s,fn} = diag([w_{1,...,J,fk}h_{1,...,J,kn}]) \quad (2)$$

$$\text{i.e., } \hat{\Sigma}_{s,fn} = \begin{bmatrix} \sum_k^K w_{1,fk}h_{1,kn} & ... & 0 \\ ... & \sum_k^K w_{2,fk}h_{2,kn} & ... \\ ... & ... & ... \\ 0 & ... & \sum_k^K w_{J,fk}h_{J,kn} \end{bmatrix} \quad (2')$$

where $w_{1,...,J,fk}$ and $h_{1,...,J,kn}$ are elements of matrices $W_{1,...,J}$ and $H_{1,...,J}$, and K is the number of the spectral components specific to source $s_j$.

The form of $\{W_j, H_j\}$ models the sources with a semantically meaningful (interpretable) representation. $W_j(\in \mathbb{R}_{\geq 0}^{F \times K})=[w_{j,fk}]$ is a nonnegative matrix that involves spectral components of the source $s_j$ as column vectors. $H_j(\in \mathbb{R}_{\geq 0}^{K \times N})=[h_{j,kn}]$ is a nonnegative matrix with row vectors that corresponds to the activation of each spectrum components. $W_j$ is referred to as spectral basis of source $s_j$. $H_j$ is referred to as activation parameters of source $s_j$.

For example, the Wiener filter $\hat{D}_{fn}$, can be estimated as $$\hat{D}_{fn} = \begin{cases} \hat{\Sigma}_{s,fn}A_f^H(A_f\hat{\Sigma}_{s,fn}A_f^H + \Sigma_{b,f})^{-1}, & (J \geq I) \\ (A_f^H\Sigma_{b,f}^{-1}A_f + \hat{\Sigma}_{s,fn}^{-1})^{-1}A_f^H\Sigma_{b,f}^{-1}, & (J < I) \end{cases} \quad (3)$$

where $\Sigma_{b,f}$ is the power spectrogram of the noise, and can be estimated via various known methods, and $A_f$ are the mixing parameters used in Equation 1.

For example, the spectral covariance matrix $\hat{C}_{S,fn}$ between sources can be estimated as $$\hat{C}_{S,fn} \leftarrow (\hat{D}_{fn}C_{X,fn}\hat{D}_{fn}^H + \hat{\Sigma}_{s,fn} - \hat{D}_{fn}A_f\hat{\Sigma}_{s,fn}) \quad (4)$$

where $C_{X,fn}$ is a covariance matrix between microphones.

For example, the cross covariance matrix $\hat{C}_{XS,fn}$ between microphones and sources can be estimated as $$\hat{C}_{XS,fn} = X_{f,n}\hat{s}_{f,n}^H \approx C_{X,fn}\hat{D}_{fn}^H \quad (5)$$

In the context of each iteration for source $s_1$ in the process 600, the number J of sources=1 because there is only one source under consideration.

At step 607, a maximization (M) step of EM iteration is performed, where the mixing parameters, the spectral basis and the activation parameters for source $s_j$ are estimated as model parameters based on the intermediate parameters estimated at step 605.

For example, the mixing parameters can be estimated as $$A_f = \sum_n (\hat{C}_{XS,fn})\left(\sum_n (\hat{C}_{S,fn})\right)^{-1} \quad (6)$$

For example, the spectral basis and the activation parameters can be estimated by iteratively applying Equation 7 and Equation 8 until convergence. For example, the iteration can converge if a cost based on the estimated spectral basis and activation parameters is small enough. An example of convergence criterion is described with Equation 2 in C Fevotte, N Bertin, J L Durrieu, "Nonnegative matrix factorization with the Itakura-Saito divergence: With application to music analysis," Neural computation, 2009, the contents of which are incorporated in their entirety herein (referred to as "reference 3" hereafter).

$$W_j \leftarrow W_j \odot (((1 \oslash W_jH_j)^2 \odot V_j)H_j^H) \oslash ((1 \oslash W_jH_j)h_j^H) \quad (7)$$

$$H_j \leftarrow H_j \odot (W_j^H(V_j) \odot (1 \oslash W_jH_j)^2) \oslash (W_j^H(1 \oslash W_jH_j)) \quad (8)$$

where $V_j$ is a simplified denotion of $V_{j,fn}=diag([\hat{C}_{S,fn}])_j$ which is a power spectrogram of sources estimated in the M step, $1_{P,Q}$ stands for an all-one element matrix with dimensions of P×Q, $\odot$ and $\oslash$ stand for element wise product and division respectively.

In another example embodiment, to remove scale and phase ambiguity, it is possible to renormalize the parameters $A_f$, $W_j$, $H_j$ in each EM iteration by imposing $\Sigma_i |a_{ij,f}|^2=1$, $a_{1j,f} \in \mathbb{R}^+$, $\Sigma_f W_{j,fk}=1$, and then scale the rows of $H_j$ accordingly.

At step 609, it is determined whether the mixing parameters estimated in the M step converges or not. If the mixing parameters estimated in the M step converges, the process 600 proceeds to step 611, and if not, the process 600 returns to step 605.

At step 611, the counter j is incremented. At step 613, it is determined whether the counter j exceeds the number of sources to be reconstructed by the reconstruction model. If the counter j exceeds the number of sources to be reconstructed by the reconstruction model, the process 600 proceeds to step 615. In another example embodiment, parameters to be estimated can be set to initial values. If not, the process 600 returns to step 605. At step 615, the process 600 ends.

In the process 600, spectral basis and mixing parameters are calculated for each individual source by using EM estimation. This means all the sources are trained independently, and thus the EM estimation for different sources can be performed in parallel, instead of in series.

As illustrated in FIG. 7, the process 700 starts from step 701. In the process 700, the spectral bases and the mixing parameters learned via the process 600 are input as fixed parameters in the EM estimation for their corresponding source.

At step 703, an expectation (E) step of EM iteration is performed, where power spectrograms of sources, a reconstruction filter such as Wiener filter, extended Kalman filter and the like, a spectral covariance matrix between sources and a cross covariance matrix between microphones and sources are estimated as intermediate parameters.

For example, power spectrograms $\hat{E}_{s,fn}$ of J sources can be estimated by using Eq. 2 with the spectral bases learned via the process 600 fixed. J represents the number of sources to be reconstructed by the reconstruction model. The Wiener filter $\hat{D}_{fn}$, can be estimated by using Equation 3 with the mixing parameters learned via the process 600 fixed. The spectral covariance matrix $\hat{C}_{S,fn}$ between the sources can be estimated by using Equation 4.

At step 705, a maximization (M) step of EM iteration is performed, where the activation parameters for the sources are estimated as model parameters based on the intermediate parameters estimated at step 703.

For example, the activation parameters can be estimated by iteratively applying Equation 8 until convergence.

At step 707, it is determined whether the power spectrogram estimated in the M step converges or not. If the power spectrogram estimated in the M step converges, the process 700 proceeds to step 709, and if not, the process 700 returns to step 703. At step 709, the process 700 ends.

In the processes illustrated in FIGS. 6 and 7, different constrained model of the source spectral properties and spatial properties are used distinctively for training phase and for testing phase. As a result, is it possible to deal with available prior information and to embed it into the estimation process.

In the processes illustrated in FIGS. 6 and 7, the IS (Itakura-Saito) divergence is used to exemplify the non-negative matrix factorization algorithm. It can be appreciated by those skilled in the art that other kinds of divergence are also applicable.

After the EM iteration in the testing phase reaches a convergence criterion, the STFT of the sources, $\hat{s}_{fn}$, is reconstructed by applying the Wiener filtering, as given in Equation 9, where the Wiener filter $\hat{D}_{fn}$, is calculated with Equation 3. Such a Wiener reconstruction is conservative in the sense that the estimated sources and the additive noise sum up to the original input audio in the STFT domain as well as the time domain.

$$\hat{s}_{fn} = \hat{D}_{fn}(x_{fn} - b_f) \tag{9}$$

Figure 9:
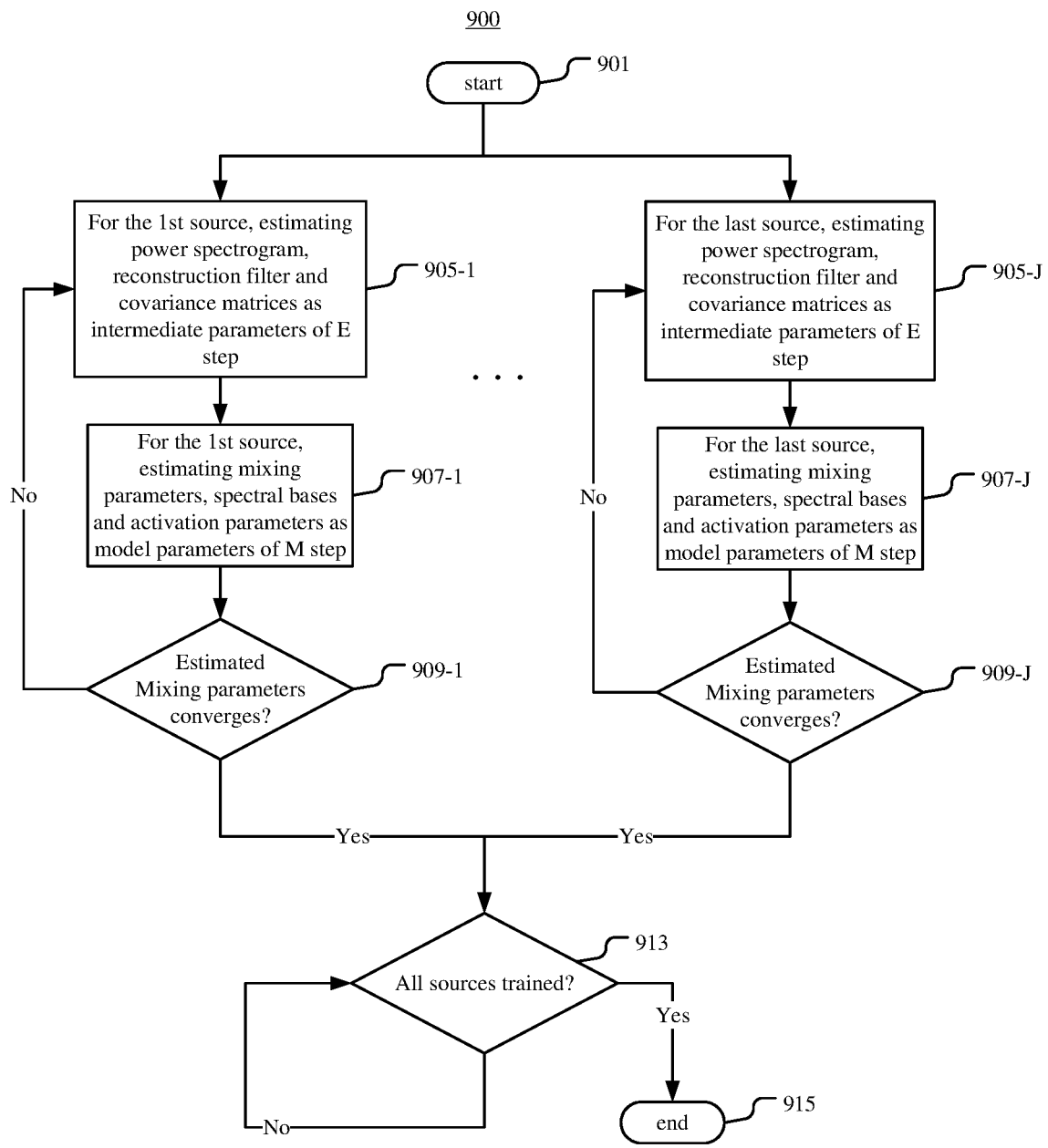
FIG. 9 is a flowchart illustrating an example process of learning the mixing parameters and the spectral bases according to an example embodiment.

Alternatively, in the further embodiment of the method 400 or the method 500 described in connection with FIGS. 6 and 7, the process 600 may be replaced with a process of learning the spectral bases via a discriminative non-negative matrix factorization method. FIG. 9 is a flowchart illustrating such an example process 900 of learning the mixing parameters and the spectral bases according to an example embodiment.

As illustrated in FIG. 9, the process 900 starts from step 901.

In the process 900, for each source $s_j$ to be reconstructed by the reconstruction model, a branch j of steps 905-j, 907-j and 909-j is started in parallel to other branches. All the branches have the same function, except for training different sources. Therefore, detailed description is provided only to a branch j of the branches.

At step 905-j, an expectation (E) step of EM iteration is performed, where power spectrograms of sources, a reconstruction filter such as Wiener filter, extended Kalman filter and the like, a spectral covariance matrix between sources and a cross covariance matrix between microphones and sources are estimated as intermediate parameters. For example, power spectrograms $\hat{\Sigma}_{S,fn}$ of J sources can be estimated with Equation 2. The Wiener filter $\hat{D}_{fn}$ can be estimated with Equation 3. The spectral covariance matrix $\hat{C}_{S,fn}$ between sources can be estimated with Equation 4. The cross covariance matrix $\hat{C}_{XS,fn}$ between microphones and sources can be estimated with Equation 5. In the context of each branch j in the process 900, the number J of sources=1 because there is only one source under consideration.

At step 907-j, a maximization (M) step of EM iteration is performed, where the mixing parameters, the spectral basis and the activation parameters for source $s_1$ are estimated as model parameters based on the intermediate parameters estimated at step 905-j. For example, the mixing parameters can be estimated with Equation 6.

For example, the spectral basis and the activation parameters can be estimated by iteratively applying Equation 10 and Equation 11 until convergence.

$$W_j \leftarrow W_j \odot \left\{ \sum_{l=1}^{N/\tau} (V_{j,l} H_j^H + 1(1 H_j^H \odot W_j) \odot W_j) \right. \tag{10}$$

$$\left. \oslash \sum_{l=1}^{N/\tau} (1 H_j^H + 1(V_{j,l} H_j^H \odot W_j) \odot W_j) \right\}$$

$$H_j \leftarrow H_j \odot \left\{ W_j^H \sum_{l=1}^{N/\tau} V_{j,l} \oslash (W_j^H 1 + \lambda) \right\} \tag{11}$$

where $\lambda$ is a parameter for enforcing a sparsity regularization. Here the generalized KL divergence is used to exemplify the non-negative matrix factorization algorithm. $1_{P,Q}$ stands for an all-one element matrix with dimensions of P×Q, $\odot$ and $\oslash$ stand for element wise product and division respectively. $V_{j,l}$ is illustrated in FIG. 8.

Figure 8:
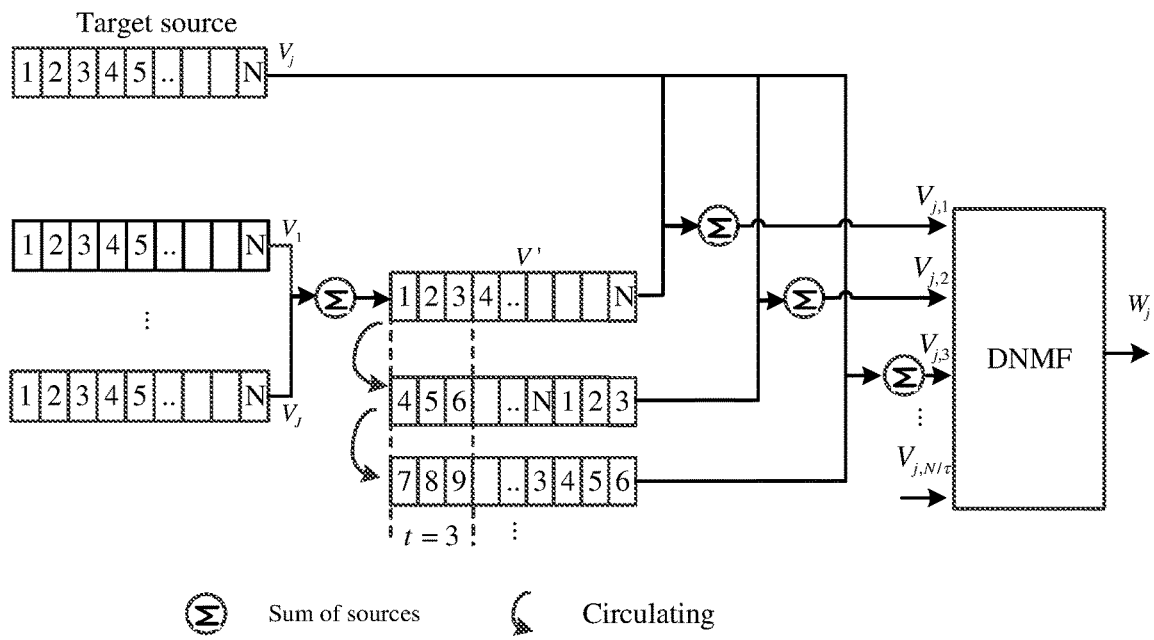
FIG. 8 is a diagram schematically illustrating the process of estimating spectral bases via a discriminative non-negative matrix factorization (DNMF) method according to an example embodiment.

FIG. 8 is a diagram schematically illustrating the process of estimating spectral bases via a discriminative non-negative matrix factorization method according to an example embodiment.

As shown in FIG. 8, for target source' power spectrogram $V_j$ under processing in the training phase, its interference sources are formed by summing up all remaining sources' power spectrograms ($V' = \Sigma_{p \neq j} V_p$) and circulating V' for every τ frames. In this way, by summing them with the target source' power spectrogram $V_j$ respectively, it is possible to generate N/τ mix sources' power spectrogram $V_{j,l}$ for each target source' power spectrogram $V_j$: $V_{j,1}, V_{j,2}, \ldots V_{j,N/\tau}$. A thorough number of all possible combinations to form a mix by the sources is much higher than N/r. In this embodiment, however, the number is scaled down to N/τ by only circulating the sum of all remaining sources.

The target source' power spectrogram $V_1$ can be estimated by computing $V_{j,fn} = \text{diag}([\hat{C}_{S,fn}])_j$. The target source' power spectrogram $V_j$ is outputted to other branches so that each branch can compute its power spectrogram $V' = \Sigma_{p \neq j} V_p$. Accordingly, if each branch has not yet received all remaining sources' power spectrograms, it has to wait for them before applying Equation 10 and Equation 11.

In another example embodiment, to remove scale and phase ambiguity, it is possible to renormalize the parameters $A_f$, $W_j$, $H_j$ in each EM iteration by imposing $\Sigma_i |a_{ij,f}|^2 = 1$, $a_{1j,f} \in \mathbb{R}^+$, $\Sigma_f W_{j,fk} = 1$, and then scale the rows of $H_j$ accordingly.

At step 909-j, it is determined whether the mixing parameters estimated in the M step converges or not. If the mixing parameters estimated in the M step converges, the branch j proceeds to step 913, and if not, the branch j returns to step 905-j.

At step 913, it is determined whether all the source have been trained. If all the source have been trained, the process 900 proceeds to step 915. If not, the process 900 repeats step 913. At step 915, the process 900 ends.

By replacing the process 600 with the process 900, it is possible to reconstruct clean sources without interference from other sources.

Further, in the process 900, the discriminative learning process is jointly performed with the EM estimation process during learning, such that the spectral bases are discriminatively optimized inside the algorithm which takes both spatial and spectral information into account, facilitating the computation of reconstruction signals from the mix.

In some application scenarios, it is feasible to pre-learn the spectral bases from a collection/library/superset of sources (in general, from a set of known sources). Because the sources are known, power spectrogram of the sources are also known. It is possible to pre-learn the spectral bases by iteratively applying Equation 7 and Equation 8 or Equation 10 and Equation 11 until convergence. This make it possible to learn the spectral bases from a superset of clean dry sources, thus it is independent of the on-site room, microphone and recording setup. This work can be done completely offline, so it is not computational sensitive.

Figure 10:
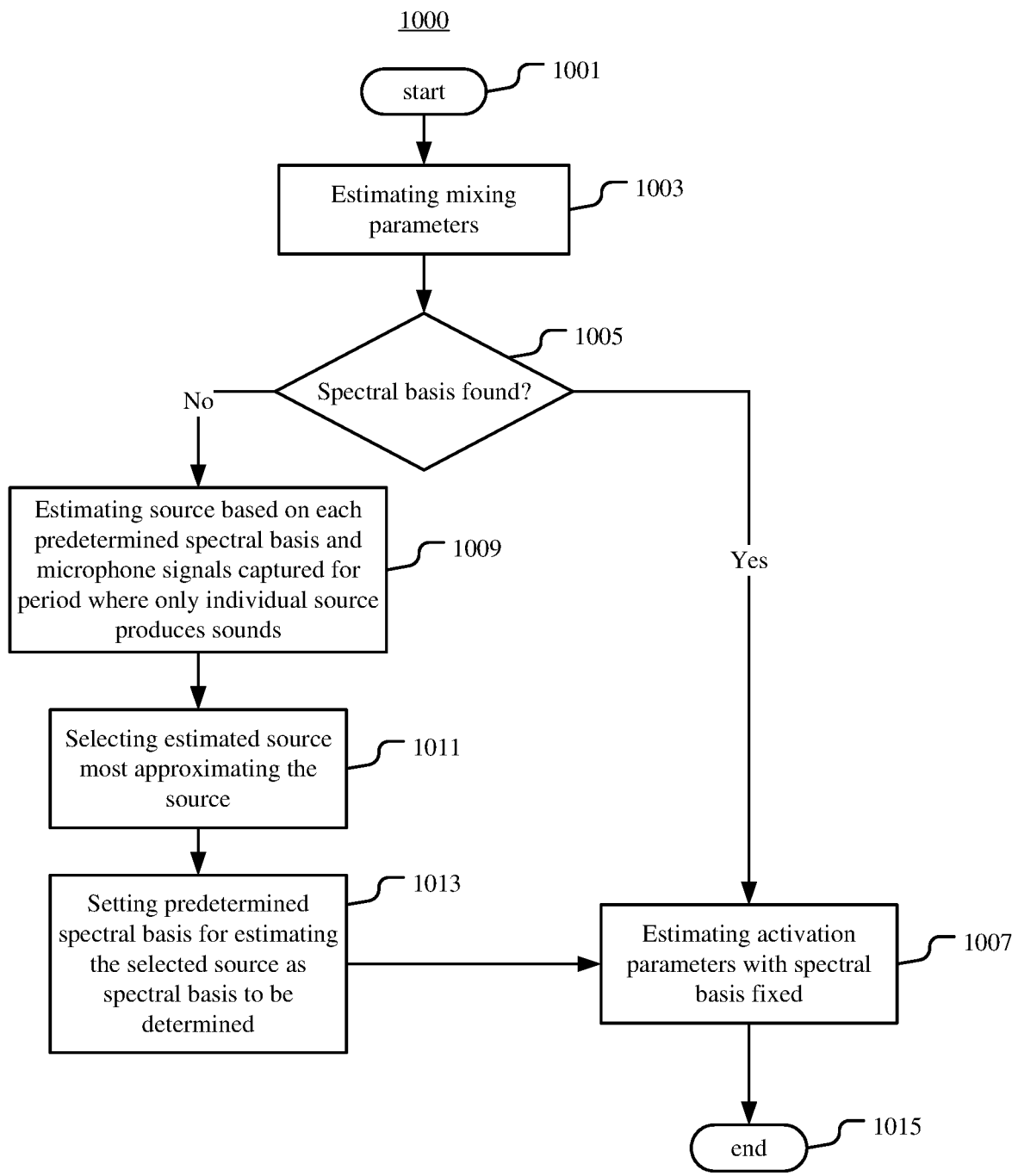
FIG. 10 is a flowchart illustrating an example process of estimating mixing parameters, spectral bases and activation parameters as model parameters of M step according to an example embodiment.

In the further embodiment of the method 400 or the method 500 described in connection with FIGS. 6 and 7, the step 607 may be performed with reference to a set of pre-learned spectral bases. FIG. 10 is a flowchart illustrating such an example process 1000 of estimating mixing parameters, spectral bases and activation parameters as model parameters of M step according to an example embodiment.

As illustrated in FIG. 10, the process 1000 starts from step 1001.

At step 1003, the mixing parameters are estimated as model parameters based on the intermediate parameters estimated at step 605. For example, the mixing parameters can be estimated with Equation 6.

At step 1005, it is determined whether the spectral basis for the source $s_j$ has been found from a set of spectral bases. If yes, the process 1000 proceeds to step 1007. If not, the process 1000 proceeds to step 1009.

At step 1009, an estimation of the source $s_1$ is computed based on each spectral basis $W'_p$ of the set of spectral bases $W'_1, \ldots W'_P$ and the microphone signals of the source $s_j$ captured for a period during which only the source $s_j$ produces sounds.

At step 1011, from the estimated sources, the estimated source most approximating the source $s_j$ is selected.

At step 1013, the spectral basis $W'_q$ in the set for computing the selected estimated source is set as the spectral basis to be determined.

At step 1007, the activation parameters can be estimated by iteratively applying Equation 8 or 10 until convergence, and by fixing $W_j$ to the spectral basis $W'_q$.

In another example embodiment, to remove scale and phase ambiguity, it is possible to renormalize the parameters $A_j$, $W_j$, $H_j$ in each EM iteration by imposing $\Sigma_i |a_{ij,f}|^2 = 1$, $a_{1j,f} \in \mathbb{R}^+$, $\Sigma_f W_{j,fk} = 1$, and then scale the rows of $H_j$ accordingly.

At step 1015, the process 1000 ends.

In an example, the estimation of the source $s_j$ of step 1009 may be computed as power spectrogram $V_j$. Each pre-learned spectral basis $W_j$ (where $j \in \mathfrak{I}$ and $\mathfrak{I}$ is a superset of all sources for a given application) is kept fixed and applied to Equation 8 or 10 to estimate $H_j$ iteratively until convergence. The minimum divergences (e.g., divergence defined in reference 3)) from all non-negative matrix factorization reconstructions (e.g., V=WH) to $V_j$ are searched and the corresponding $W_j$ is fixed as the best spectral basis at step 1011.

During the testing phase, the multi-channel images of the separated sources are expected to sum up equal to the multi-channel microphone signals. So unlike de-reverberation tasks, the goal is NOT to recover the original dry clean sources. Instead, the application requires outputting the reverberant spatial projections of each source to the microphones. Hence it is possible to learn the mixing parameters during the training phase, and enforce the spatial projection during the testing phase for the reverberant source separation. This method can cause the following benefits: 1) speeding up the training; 2) avoiding algorithm-related estimation instability and inaccuracy during training; 3) potential to improve separation performance in the testing phase as well. This method is suitable for applications with high computational sensitivity for the on-site training phase.

Figure 11:
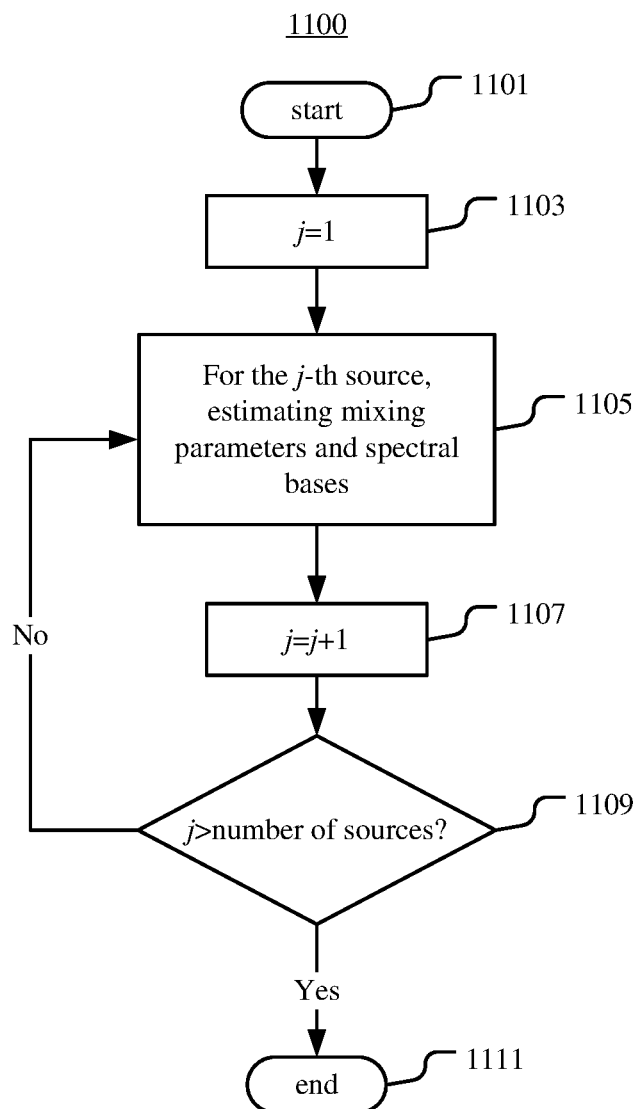
FIG. 11 is a flowchart illustrating an example process of learning the mixing parameters and the spectral bases according to an example embodiment.

Alternatively, in the further embodiment of the method 400 or the method 500 described in connection with FIGS. 6 and 7, the process 600 may be replaced with a process of learning the spectral bases and the mixing parameters where learning a spectral basis of the at least one source via a non-negative matrix factorization method by considering a power spectrogram of the microphone signals of each source, captured for a period during which only the source produces sounds, as a power spectrogram of the source. FIG. 11 is a flowchart illustrating such an example process 1100 of learning the mixing parameters and the spectral bases according to an example embodiment.

As illustrated in FIG. 11, the process 1100 starts from step 1101.

At step 1103, a counter j is set for example to 1.

At step 1105, the mixing parameters can be estimated as $$A_{j,f} = \sum_n (\hat{C}_{XX_p,fn}) \left( \sum_n (\hat{C}_{X_p X_p,fn}) \right)^{-1} \quad (6')$$

where $A_{j,f}$ represents the mixing parameters characterized as ratios between spatial images $s_{j1}^{img}, \ldots s_{jI}^{img}$ of the source $s_j$ on the microphones $mic_1, \ldots mic_I$ and the spatial image $s_{jp}^{img}$ of the source $s_j$ on the microphones $mic_p$, $\hat{C}_{X_p X_p,fn}$ is the covariance matrix of the signal of microphones $mic_p$ (in this case, $\hat{C}_{X_p X_p,fn}$ is actually a 1×1 matrix which has just one value, representing the spectral power of the $mic_p$ signal), and $\hat{C}_{XX_p,fn}$ is a cross covariance matrix between the microphones $mic_1, \ldots, mic_I$ and $mic_p$.

Further, the spectral basis $W_j$ of the source $s_j$ can be estimated via a non-negative matrix factorization method by computing the power spectrogram X of the microphones signals and assuming the power spectrogram X as the power spectrogram of the source $s_j$ by way of $X = W_j H_j$.

At step 1107 the counter j is incremented.

At step 1109, it is determined whether the counter j exceeds the number of sources to be reconstructed by the reconstruction model. If the counter j exceeds the number of sources to be reconstructed by the reconstruction model, the process 1100 proceeds to step 1111. If not, the process 1100 returns to step 1105. At step 1111, the process 1100 ends.

To deal with realistic reverberant environment with longer reverberant time, it is possible to use a full-rank reverberant model, where a square matrix $A_j$ with 1×1 dimension models a source $s_j$'s spatial parameter, and the spatial covariance matrix $R_j = A_j A_j^H$ represents the mixing parameters. The separation output may be simplified to STFT of the spatial images $\hat{S}_j$ of source $s_j$, since the target is to get the spatial images of all sources which can recover the mix.

Figure 12:
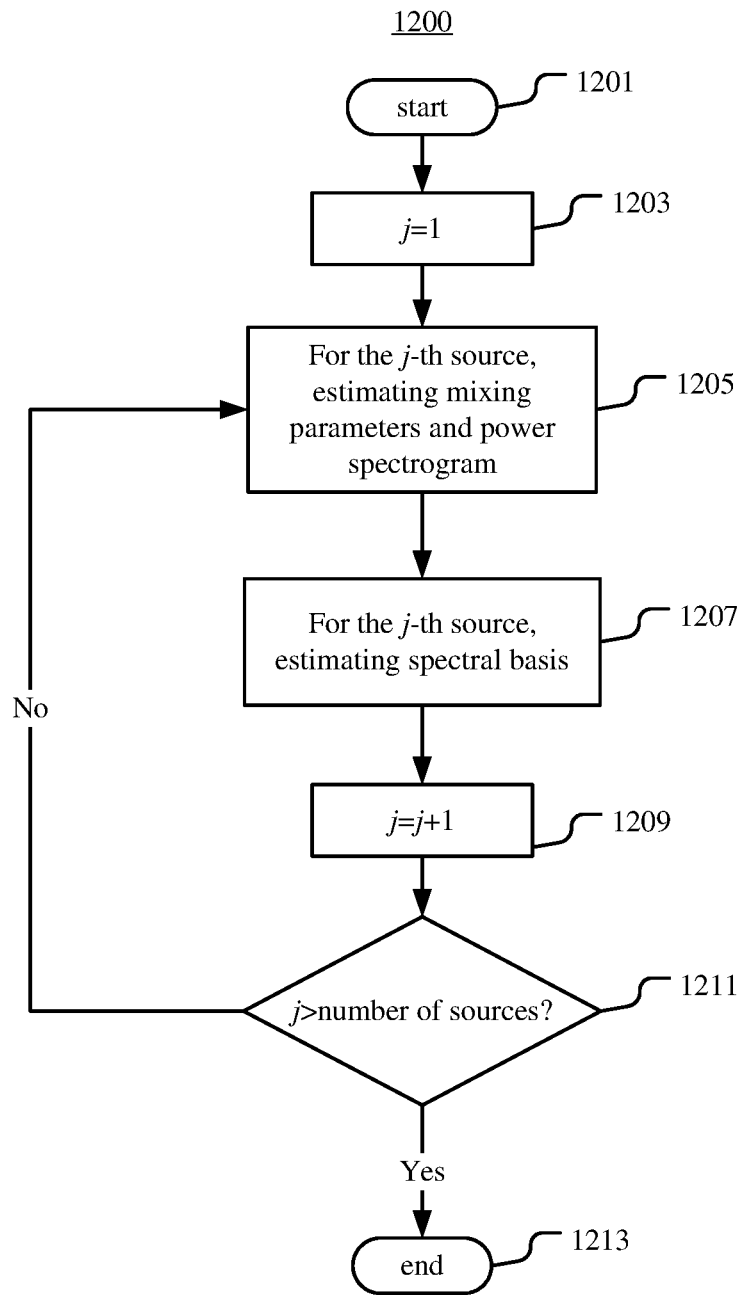
FIG. 12 is a flowchart illustrating an example process of learning the mixing parameters and the spectral bases in an example embodiment.
Figure 13:
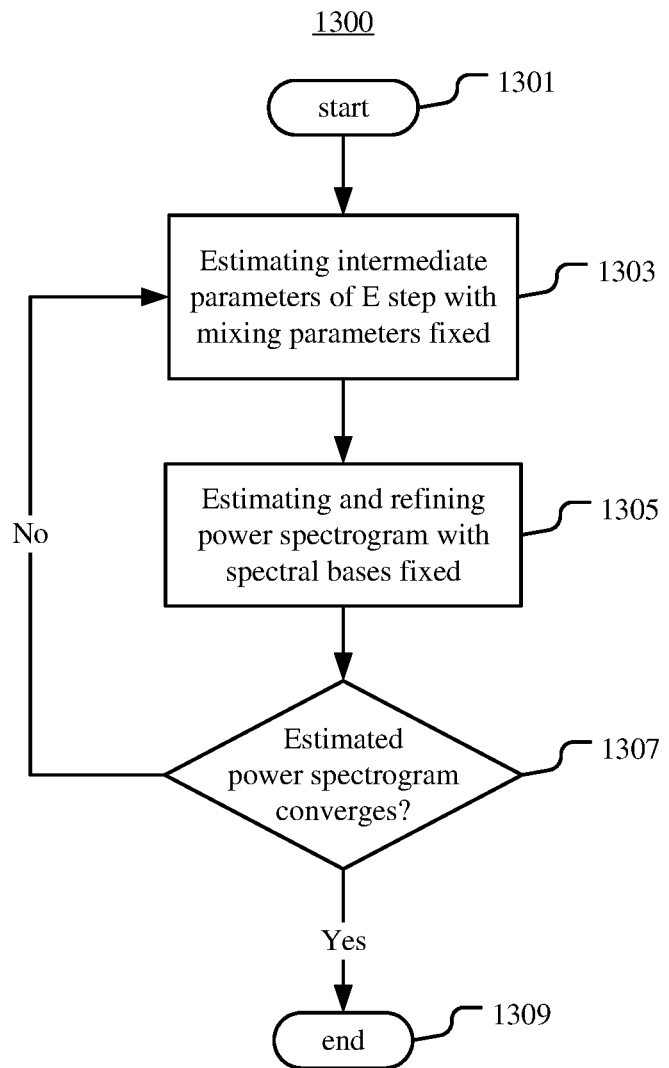
FIG. 13 is a flowchart illustrating an example process of estimating the reconstruction model in this embodiment.

In a further embodiment of the method 400 or the method 500, the estimating of the reconstruction model is completed on condition that a power spectrogram of each source converges. The estimating of the reconstruction model comprises refining the power spectrogram via a non-negative matrix factorization method based on the spectral basis. FIG. 12 is a flowchart illustrating an example process 1200 of learning the mixing parameters and the spectral bases in this embodiment. FIG. 13 is a flowchart illustrating an example process 1300 of estimating the reconstruction model in this embodiment.

As illustrated in FIG. 12, the process 1200 starts from step 1201.

At step 1203, a counter j is set for example to 1. In another example embodiment, parameters to be estimated can be set to initial values. At step 1205, the mixing parameters of source $s_j$ is estimated as $$R_{j,f} = \frac{1}{N}\sum_{n=1}^{N}\frac{1}{v_{j,fn}}\hat{C}_{\tilde{S}_j,fn} \qquad (12)$$

and the power spectrogram of the source $s_j$ is estimated as $$v_{j,fn} = \frac{1}{I}\text{trace}\left(R_{j,f}^{-1}\hat{C}_{\tilde{S}_j,fn}\right) \qquad (13)$$

where $\hat{C}_{\tilde{S}_j,fn}$ is covariance matrix of the spatial images of the source $s_j$, $v_{j,fn}$ is the power spectrogram of the source $s_j$. In another example embodiment, to remove scale ambiguity, it is possible to renormalize the mixing parameters $R_{j,f}$ in each EM iteration by imposing trace $(R_{j,f})=I$, which is echoing the re-normalization process as described in other embodiments as $\Sigma_i |a_{ij,f}|^2 = 1$.

For the on-site training phase, J=1 and $\hat{C}_{\tilde{S}_j,fn}$ is equal to the covariance matrix of the microphone signals: $\hat{C}_{\tilde{S}_j,fn} = X_{fn}X_{fn}^H$, thus it is possible to directly compute the power spectrogram $v_{j,fn}$ and the mixing parameters $R_{j,f}$. By imbedding $\hat{C}_{\tilde{S}_j,fn} = X_{fn}X_{fn}^H$ and the re-normalization trace $(R_{j,f})=I$ into Equation 12, the mixing parameters of source $s_j$ can be estimated as $$R_{j,f} = I \cdot \Sigma_{n=1}^{N} X_{fn} X_{fn}^H / \text{trace}(\Sigma_{n=1}^{N} X_{fn} X_{fn}^H) \qquad (14)$$

Then $v_{j,fn}$ can be calculated by embedding $\hat{C}_{\tilde{S}_j,fn} = X_{fn}X_{fn}^H$ into Equation 13, such that the power spectrogram of the source $s_j$ can be estimated as $$v_{j,fn} = \frac{1}{I}\text{trace}(R_{j,f}^{-1}(X_{fn}X_{fn}^H)) \qquad (15)$$

At step 1207, the spectral basis of the source $s_j$ is learned by iteratively applying Equation 7 and Equation 8 or Equation 10 and Equation 11 until convergence.

At step 1209, the counter j is incremented.

At step 1211, it is determined whether the counter j exceeds the number of sources to be reconstructed by the reconstruction model. If the counter j exceeds the number of sources to be reconstructed by the reconstruction model, the process 1200 proceeds to step 1213. If not, the process 1200 returns to step 1205.

At step 1213, the process 1200 ends.

As illustrated in FIG. 13, the process 1300 starts from step 1301. In the process 1300, the spectral bases and the mixing parameters learned via the process 1200 are input as fixed parameters in the EM estimation for their corresponding source.

At step 1303, an expectation (E) step of EM iteration is performed to estimate intermediate parameters. Specifically, with the mixing parameter $R_{j,f}$ fixed, the covariance matrix of the microphone signals given the parameters is estimated as $$C_{x,fn} = \sum_{j=1}^{J} R_{j,f} v_{j,fn} \qquad (16)$$

With the mixing parameter $R_{j,f}$ fixed, the covariance matrix of the spatial images of each source $s_j$ given the parameters is estimated as $$C_{\tilde{S}_j,fn} = R_{j,f} v_{j,fn} \qquad (17)$$

The Wiener filter for each source $s_j$ is estimated as $$D_{j,fn} = C_{\tilde{S}_j,fn} C_{x,fn}^{-1} \qquad (18)$$

The spatial images of each source $s_j$ is estimated as $$\tilde{S}_{j,fn} = D_{j,fn} X_{fn} \qquad (19)$$

The covariance matrix of the spatial images of each source is estimated as $$\hat{C}_{\tilde{S}_j,fn} = \tilde{S}_{j,fn}\tilde{S}_{j,fn}^H + C_{\tilde{S}_j,fn} - D_{j,fn} C_{\tilde{S}_j,fn} \qquad (20)$$

At step 1305, a maximization (M) step of EM iteration is performed to estimate the model parameters based on the intermediate parameters estimated at step 1303.

Specifically, power spectrogram $v_{j,fn}$ of each source $s_j$ is computed by using Equation 13, where the mixing parameters $R_j$ is fixed.

Then $v_{j,fn}$ is refined by non-negative matrix factorization using Equation 8 and 2, with the spectral basis fixed.

At step 1307, it is determined whether the power spectrogram estimated in the M step converges or not. If the power spectrogram estimated in the M step converges, the process 1300 proceeds to step 1309, and if not, the process 1300 returns to step 1303.

At step 1309, the process 1300 ends.

Figure 14:
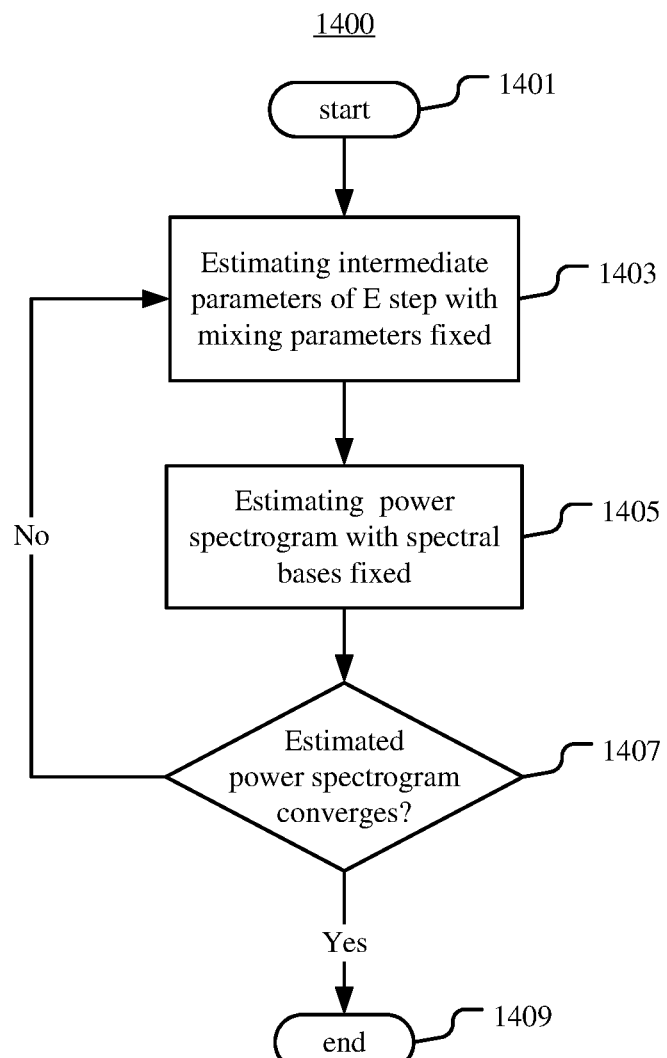
FIG. 14 is a flowchart illustrating an example process of performing the estimating of the reconstruction model.

In a further embodiment of the method 100 or the method 300 described in connection with FIG. 1 or 3, the step 103 or 305 may be performed by computing the mixing parameters $R_1$ of each source $s_j$ with Equation 14. The step 105 or 309 may be performed via an EM algorithm, where the estimating of the reconstruction model is completed on condition that a power spectrogram of each source converges, and the estimating of the reconstruction model comprises deriving the power spectrogram from the mixing parameters of the source and estimated covariance of spatial images of the source. FIG. 14 is a flowchart illustrating such an example process 1400 of performing the estimating of the reconstruction model of step 105 or 309.

As illustrated in FIG. 14, the process 1400 starts from step 1401. In the process 1400, the mixing parameters learned via the method 100 or 300 are input as fixed parameters in the EM estimation for their corresponding source.

At step 1403, an expectation (E) step of EM iteration is performed to estimate intermediate parameters. Specifically, with the mixing parameter $R_{j,f}$ fixed, the covariance matrix of the microphone signals given the parameters is estimated with Equation 16. With the mixing parameter $R_{j,f}$ fixed, the covariance matrix of the spatial images of each source $s_j$ given the parameters is estimated with Equation 17. The Wiener filter for each source $s_j$ is estimated with Equation 18. The spatial images of each source $s_j$ are estimated with Equation 19. The covariance matrix of the spatial images of each source is estimated with Equation 20.

At step 1405, a maximization (M) step of EM iteration is performed to estimate the model parameters based on the intermediate parameters estimated at step 1403.

Specifically, power spectrogram $v_j$ of each source $s_j$ is computed by using Equation 13, where the mixing parameters $R_j$ is fixed.

At step 1407, it is determined whether the power spectrogram estimated in the M step converges or not. If the power spectrogram estimated in the M step converges, the process 1400 proceeds to step 1409, and if not, the process 1400 returns to step 1403.

At step 1409, the process 1400 ends.

Various aspects of the present invention may be appreciated from the following enumerated example embodiments (EEEs).

EEE 1. A method of generating a reconstruction model for source separation, comprising: learning, by a processor, mixing parameters for modeling acoustic paths between at least one source and at least two microphones based on first microphone signals, under an assumption that the first microphone signals for each individual one of the at least one source are captured respectively by the at least two microphones for a period during which only the individual one produces sounds; and estimating, by the processor, the reconstruction model based on the mixing parameters and second microphone signals, under an assumption that the second microphone signals are captured respectively by the at least two microphones for a period during which all of the at least one source produce sounds.

EEE 2. The method according to EEE 1, wherein the reconstruction model is adapted to reconstruct spatial images of the at least one source on the microphones.

EEE 3. The method according to EEE 2, wherein the mixing parameters for each source are characterized as spatial covariance of the source.

EEE 4. The method according to EEE 3, further comprising: learning, by the processor, a spectral basis of the at least one source based on the first microphone signals via a non-negative matrix factorization method or a discriminative non-negative matrix factorization method, and wherein the estimating of the reconstruction model comprises estimating the reconstruction model based on the mixing parameters, the spectral basis and the second microphone signals.

EEE 5. The method according to EEE 4, wherein the estimating of the reconstruction model is completed on condition that a power spectrogram of each source converges, and the estimating of the reconstruction model comprises refining the power spectrogram via a non-negative matrix factorization method based on the spectral basis.

EEE 6. The method according to EEE 3, wherein the estimating of the reconstruction model is completed on condition that a power spectrogram of each source converges, and the estimating of the reconstruction model comprises deriving the power spectrogram from the mixing parameters of the source and estimated covariance of spatial images of the source.

EEE 7. The method according to EEE 2, wherein the mixing parameters for each of the at least one source are characterized as ratios between spatial images of the source on the microphones and the spatial image of the source on a reference one of the microphones.

EEE 8. The method according to EEE 7, further comprising learning, by the processor, a spectral basis of the at least one source via a non-negative matrix factorization method by considering a power spectrogram of the first microphone signals of each source as a power spectrogram of the source, and wherein the estimating of the reconstruction model comprises estimating the reconstruction model based on the mixing parameters, the spectral basis and the second microphone signals.

EEE 9. The method according to EEE 1, wherein the reconstruction model is adapted to reconstruct a source signal of each of the at least one source.

EEE 10. The method according to EEE 9, further comprising:

determining, by the processor, a spectral basis of each of the at least one source based on the first microphone signals via a non-negative matrix factorization method or a discriminative non-negative matrix factorization method, and wherein the estimating of the reconstruction model comprises estimating the reconstruction model based on the mixing parameters, the spectral basis and the second microphone signals.

EEE 11. The method according to EEE 10, wherein the estimating of the reconstruction model is completed on condition that a power spectrogram of each of the at least one source converges, and the estimating of the reconstruction model comprises deriving the power spectrogram from estimated covariance of the at least one source.

EEE 12. The method according to EEE 10, wherein for each of the at least one source, the determining of the spectral basis comprises:

based on each of plurality of predetermined spectral bases and the first microphone signals of the source, estimating the source; and selecting one of the estimated source most approximating the source; and setting the predetermined spectral basis for estimating the selected estimated source as the spectral basis to be determined.

EEE 13. A method for source separation, comprising:

capturing first microphone signals for each individual one of at least one source respectively by at least two microphones for a period during which only the individual one produces sound; learning, by a processor, mixing parameters for modeling acoustic paths between the at least one source and the at least two microphones based on the first microphone signals;

capturing second microphone signals respectively by the at least two microphones for a period during which all of the at least one source produce sounds;

estimating, by the processor, the reconstruction model based on the mixing parameters and the second microphone signals; and performing, by the processor, the source separation by applying the reconstruction model.

EEE 14. The method according to EEE 13, wherein the reconstruction model is adapted to reconstruct spatial images of the at least one source on the microphones.

EEE 15. The method according to EEE 14, wherein the mixing parameters for each source are characterized as spatial covariance of the source.

EEE 16. The method according to EEE 15, further comprising:

learning, by the processor, a spectral basis of the at least one source based on the first microphone signals via a non-negative matrix factorization method or a discriminative non-negative matrix factorization method, and wherein the estimating of the reconstruction model comprises estimating the reconstruction model based on the mixing parameters, the spectral basis and the second microphone signals.

EEE 17. The method according to EEE 16, wherein the estimating of the reconstruction model is completed on condition that a power spectrogram of each source converges, and the estimating of the reconstruction model comprises refining the power spectrogram via a non-negative matrix factorization method based on the spectral basis.

EEE 18. The method according to EEE 15, wherein the estimating of the reconstruction model is completed on condition that a power spectrogram of each source converges, and the estimating of the reconstruction model comprises deriving the power spectrogram from the mixing parameters of the source and estimated covariance of spatial images of the source.

EEE 19. The method according to EEE 14, wherein the mixing parameters for each of the at least one source are characterized as ratios between spatial images of the source on the microphones and the spatial image of the source on a reference one of the microphones.

EEE 20. The method according to EEE 19, further comprising learning, by the processor, a spectral basis of the at least one source via a non-negative matrix factorization method by considering a power spectrogram of the first microphone signals of each source as a power spectrogram of the source, and wherein the estimating of the reconstruction model comprises estimating the reconstruction model based on the mixing parameters, the spectral basis and the second microphone signals.

EEE 21. The method according to EEE 13, wherein the reconstruction model is adapted to reconstruct a source signal of each of the at least one source.

EEE 22. The method according to EEE 21, further comprising:
determining, by the processor, a spectral basis of each of the at least one source based on the first microphone signals via a non-negative matrix factorization method or a discriminative non-negative matrix factorization method, and
wherein the estimating of the reconstruction model comprises estimating the reconstruction model based on the mixing parameters, the spectral basis and the second microphone signals.

EEE 23. The method according to EEE 22, wherein the estimating of the reconstruction model is completed on condition that a power spectrogram of each of the at least one source converges, and
the estimating of the reconstruction model comprises deriving the power spectrogram from estimated covariance of the at least one source.

EEE 24. The method according to EEE 22, wherein for each of the at least one source, the determining of the spectral basis comprises:
based on each of plurality of predetermined spectral bases and the first microphone signals of the source, estimating the source; and
selecting one of the estimated source most approximating the source; and
setting the predetermined spectral basis for estimating the selected estimated source as the spectral basis to be determined.

EEE 25. A signal processing apparatus, comprising a processor configured to execute the method according any one of EEEs 1-12.

The invention claimed is:

1. A method of generating a reconstruction model for source separation, characterized by comprising:
learning, by a processor, mixing parameters for modeling acoustic paths between at least one source and at least two microphones based on first microphone signals, and a spectral basis of the at least one source via a non-negative matrix factorization method by considering a power spectrogram of the first microphone signals of each source as a power spectrogram of the source, under an assumption that the first microphone signals for each individual one of the at least one source are captured respectively by the at least two microphones for a period during which only the individual one produces sounds; and
estimating, by the processor, the reconstruction model based on the mixing parameters, the spectral basis and second microphone signals, under an assumption that the second microphone signals are captured respectively by the at least two microphones for a period during which all of the at least one source produce sounds, wherein the reconstruction model is adapted to reconstruct spatial images of the at least one source on the microphones, and wherein the mixing parameters for each of the at least one source are characterized as ratios between spatial images of the source on the microphones and the spatial image of the source on a reference one of the microphones.

2. The method according to claim 1, characterized in that the mixing parameters for each source are characterized as spatial covariance of the source.

3. The method according to claim 2, characterized by comprising:
learning, by the processor, a spectral basis of the at least one source based on the first microphone signals via a non-negative matrix factorization method or a discriminative non-negative matrix factorization method,
wherein the estimating of the reconstruction model comprises estimating (405) the reconstruction model based on the mixing parameters, the spectral basis and the second microphone signals.

4. The method according to claim 3, characterized in that the estimating of the reconstruction model is completed on condition that a power spectrogram of each source converges, and
the estimating of the reconstruction model comprises refining the power spectrogram via a non-negative matrix factorization method based on the spectral basis.

5. The method according to claim 2, characterized in that the estimating of the reconstruction model is completed on condition that a power spectrogram of each source converges, and
the estimating of the reconstruction model comprises deriving the power spectrogram from the mixing parameters of the source and estimated covariance of spatial images of the source.

6. The method according to claim 1, characterized in that the reconstruction model is adapted to reconstruct a source signal of each of the at least one source.

7. The method according to claim 6, characterized by further comprising:
determining, by the processor, a spectral basis of each of the at least one source based on the first microphone signals via a non-negative matrix factorization method or a discriminative non-negative matrix factorization method,
wherein the estimating of the reconstruction model comprises estimating the reconstruction model based on the mixing parameters, the spectral basis and the second microphone signals.

8. The method according to claim 7, characterized in that the estimating of the reconstruction model is completed on condition that a power spectrogram of each of the at least one source converges, and
the estimating of the reconstruction model comprises deriving the power spectrogram from estimated covariance of the at least one source.

9. The method according to claim 7, characterized in that for each of the at least one source, the determining of the spectral basis comprises:
based on each of plurality of predetermined spectral bases and the first microphone signals of the source, estimating the source, wherein the predetermined spectral bases are pre-learned spectral bases from a collection of known sources;

selecting one of the estimated source most approximating the source; and setting the predetermined spectral basis for estimating the selected estimated source as the spectral basis to be determined.

10. The method according to claim 1, further comprising: capturing the first microphone signals and/or the second microphone signals.

11. The method according to claim 1, further comprising: performing, by the processor, source separation by applying the reconstruction model.

12. A signal processing apparatus, characterized by comprising a processor configured to execute the method according claim 1.

13. A method for source separation, characterized by comprising:

capturing first microphone signals for each individual one of at least one source respectively by at least two microphones for a period during which only the individual one produces sound;

learning, by a processor, mixing parameters for modeling acoustic paths between the at least one source and the at least two microphones based on the first microphone signals and a spectral basis of the at least one source via a non-negative matrix factorization method by considering a power spectrogram of the first microphone signals of each source as a power spectrogram of the source;

capturing second microphone signals respectively by the at least two microphones for a period during which all of the at least one source produce sounds;

estimating, by the processor, the reconstruction model based on the mixing parameters, the spectral basis and the second microphone signals, wherein the reconstruction model is adapted to reconstruct spatial images of the at least one source on the microphones, and wherein the mixing parameters for each of the at least one source are characterized as ratios between spatial images of the source on the microphones and the spatial image of the source on a reference one of the microphones; and performing, by the processor, the source separation by applying the reconstruction model.

14. The method according to claim 13, wherein the mixing parameters for each source are characterized as spatial covariance of the source.

15. The method according to claim 14, further comprising:

learning, by the processor, a spectral basis of the at least one source based on the first microphone signals via a non-negative matrix factorization method or a discriminative non-negative matrix factorization method, wherein the estimating of the reconstruction model comprises estimating the reconstruction model based on the mixing parameters, the spectral basis and the second microphone signals.

16. The method according to claim 15, wherein the estimating of the reconstruction model is completed on condition that a power spectrogram of each source converges, and the estimating of the reconstruction model comprises refining the power spectrogram via a non-negative matrix factorization method based on the spectral basis.

17. The method according to claim 14, wherein the estimating of the reconstruction model is completed on condition that a power spectrogram of each source converges, and the estimating of the reconstruction model comprises deriving the power spectrogram from the mixing parameters of the source and estimated covariance of spatial images of the source.

18. The method according to claim 13, wherein the reconstruction model is adapted to reconstruct a source signal of each of the at least one source.

19. The method according to claim 18, further comprising:

determining, by the processor, a spectral basis of each of the at least one source based on the first microphone signals via a non-negative matrix factorization method or a discriminative non-negative matrix factorization method, wherein the estimating of the reconstruction model comprises estimating the reconstruction model based on the mixing parameters, the spectral basis and the second microphone signals.

20. The method according to claim 19, wherein the estimating of the reconstruction model is completed on condition that a power spectrogram of each of the at least one source converges, and the estimating of the reconstruction model comprises deriving the power spectrogram from estimated covariance of the at least one source.

21. The method according to claim 19, wherein for each of the at least one source, the determining of the spectral basis comprises:

based on each of plurality of predetermined spectral bases and the first microphone signals of the source, estimating the source, wherein the predetermined spectral bases are pre-learned spectral bases from a collection of known sources;

selecting one of the estimated source most approximating the source; and setting the predetermined spectral basis for estimating the selected estimated source as the spectral basis to be determined.

* * * * *